(12) United States Patent
Li et al.

(10) Patent No.: US 7,205,248 B2
(45) Date of Patent: Apr. 17, 2007

(54) METHOD OF ELIMINATING RESIDUAL CARBON FROM FLOWABLE OXIDE FILL

(75) Inventors: Li Li, Boise, ID (US); Weimin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/357,812

(22) Filed: Feb. 4, 2003

(65) Prior Publication Data

US 2004/0152342 A1 Aug. 5, 2004

(51) Int. Cl.
*H01L 21/76* (2006.01)
*H01L 21/31* (2006.01)

(52) U.S. Cl. .................. 438/788; 438/404; 438/424; 257/E21.277; 257/E21.279

(58) Field of Classification Search ............ 438/758, 438/404, 424, 788
See application file for complete search history.

(56) References Cited

U.S. PATENT DOCUMENTS

| | | | |
|---|---|---|---|
| 5,314,724 A | 5/1994 | Tsukune et al. | 427/489 |
| 5,665,849 A | 9/1997 | Cho | 528/31 |
| 5,749,975 A | 5/1998 | Li et al. | 134/1.3 |
| 5,858,880 A | 1/1999 | Dobson et al. | 438/758 |
| 5,874,367 A | 2/1999 | Dobson | 438/787 |
| 5,882,981 A | 3/1999 | Rajgopal et al. | 438/404 |
| 5,895,272 A | 4/1999 | Li | 438/705 |
| 6,105,588 A | 8/2000 | Li et al. | 134/1.1 |
| 6,156,674 A * | 12/2000 | Li et al. | 438/780 |
| 6,174,451 B1 * | 1/2001 | Hung et al. | 216/67 |
| 6,221,780 B1 * | 4/2001 | Greco et al. | 438/702 |
| 6,294,476 B1 | 9/2001 | Lin et al. | 438/725 |
| 6,300,219 B1 | 10/2001 | Doan et al. | 438/424 |
| 6,323,101 B1 | 11/2001 | Li et al. | 438/404 |
| 6,355,580 B1 | 3/2002 | Li et al. | 438/788 |
| 6,368,988 B1 | 4/2002 | Li et al. | 438/792 |
| 6,383,951 B1 | 5/2002 | Li | 438/781 |
| 6,387,287 B1 * | 5/2002 | Hung et al. | 216/67 |
| 6,395,647 B1 | 5/2002 | Li et al. | 438/758 |
| 6,413,879 B1 | 7/2002 | Maeda | 438/758 |
| 6,429,496 B1 | 8/2002 | Li et al. | 438/411 |
| 6,436,808 B1 | 8/2002 | Ngo et al. | 438/623 |
| 6,437,417 B1 | 8/2002 | Gilton | 257/506 |
| 6,455,394 B1 | 9/2002 | Iyer et al. | 438/428 |
| 6,465,366 B1 | 10/2002 | Nemani et al. | 438/778 |
| 6,465,828 B2 | 10/2002 | Agarwal | 257/296 |
| 6,465,829 B2 | 10/2002 | Takeda et al. | 257/300 |
| 6,485,815 B1 | 11/2002 | Jeong et al. | 428/210 |
| 6,524,975 B2 | 2/2003 | Li et al. | 438/788 |
| 6,593,247 B1 * | 7/2003 | Huang et al. | 438/758 |
| 6,602,434 B1 * | 8/2003 | Hung et al. | 216/39 |
| 6,613,691 B1 * | 9/2003 | Hung et al. | 438/723 |
| 6,630,390 B2 * | 10/2003 | Andideh et al. | 438/427 |
| 6,635,575 B1 | 10/2003 | Xia et al. | 438/697 |
| 6,798,038 B2 | 9/2004 | Sato et al. | 257/510 |
| 6,806,207 B2 * | 10/2004 | Huang et al. | 438/758 |
| 2001/0039125 A1 | 11/2001 | Hara | 438/763 |

(Continued)

OTHER PUBLICATIONS

Borvon, A. et al., *Plasma and Polymers*, vol. 7, No. 4, Dec. 2002, pp. 341-352.

(Continued)

*Primary Examiner*—Alexander Ghyka
(74) *Attorney, Agent, or Firm*—Whyte Hirschboeck Dudek SC

(57) ABSTRACT

Methods of forming an oxide layer such as high aspect ratio trench isolations, and treating the oxide substrate to remove carbon, structures formed by the method, and devices and systems incorporating the oxide material are provided.

64 Claims, 4 Drawing Sheets

U.S. PATENT DOCUMENTS

| | | | |
|---|---|---|---|
| 2002/0001219 A1 | 1/2002 | Forbes et al. | 365/145 |
| 2002/0098662 A1 | 7/2002 | Li | 438/424 |
| 2002/0098684 A1 | 7/2002 | Li et al. | 438/630 |
| 2002/0105084 A1 | 8/2002 | Li | 257/759 |
| 2002/0134405 A1 | 9/2002 | Li et al. | 134/1.3 |
| 2002/0163028 A1 | 11/2002 | Yuan | 257/303 |
| 2002/0187628 A1 | 12/2002 | Li et al. | 438/623 |

OTHER PUBLICATIONS

Ando, T. et al., *Electrochemical Society Proceedings*, vol. 97-30, pp. 231-242 (1997).

SiLK Dielectric Resins, The Dow Chemical Company, http://www.dow.com/silk, Dec. 2002.

Applied Materials—Black Diamond, http://www.appliedmaterials.com/products/black_diamond.html, Dec. 2002.

Institute of Microelectronics—Deep Submicron—Dielectrics and CMP Module, http://www.ime.a-star.cdu.sg/deep/deep_dielec.asp, Dec. 2002.

Silicone Technology, Inter Silicone Corp., http://global-mart.co.kr/RD/Contemporary%20Technology-1.htm, Dec. 2002.

Peters, Laura, *Semiconductor International*, http://www.jysong.idv.tw/cu/articles/cu0008.htm, Sep. 1998.

\* cited by examiner

METHOD OF ELIMINATING RESIDUAL CARBON FROM FLOWABLE OXIDE FILL

FIELD OF THE INVENTION

The invention relates generally to semiconductor processing methods of forming and utilizing insulative materials for electrical isolation in integrated circuits, and more particularly to a post-deposition treatment of flowable oxide fill materials to eliminate residual carbon from the material.

BACKGROUND OF THE INVENTION

With advancements in semiconductor integrated circuit technology, device dimensions and component spacing continues to shrink, requiring the devices to be placed in close proximity to each other. Insulative materials are widely used in semiconductor fabrication methods for forming structures to electrically isolate the various active components formed in integrated circuits. Devices that extend into a semiconductive substrate can be electrically isolated by insulative materials formed within the substrate between the components, for example, trench isolation regions. In such a technique, trenches are etched into a silicon substrate, usually by anisotropic etching, and the trenches are subsequently filled by the deposition of an oxide such as silicon dioxide ($SiO_2$).

An oxide is often deposited by chemical vapor deposition (CVD) as a conformal layer of $SiO_2$. In the trenches, the conformal layers of oxide are initially formed on the sidewalls and grow in size outward into the center of the trench to where the oxide layers meet. However, as device dimensions become smaller and trench widths become narrower, such techniques can result in voids formed in the oxide fill, which impair the isolation capability of the trench.

In an attempt to eliminate voids in a high aspect ratio trench feature, flowable oxides have been developed that provide good gapfill properties. One such flowable oxide that has been employed is formed by depositing trimethylsilane (($CH_3)_3SiH$) (TMS) and ozone ($O_3$) by CVD to fill the gap and eliminate void formation. However, the presence of residual carbon from the hydrocarbon portion of the precursor provides a high carbon content in the oxide material that causes the fill to be soft and unstable to various processes such as wet etches, resulting in device degradation.

Attempts to reduce the carbon content in the film have included changing the deposition process by altering the ozone composition, the ozone flow, the ratio of $O_3$:TMS flowed into the chamber, and staggering the inflow of gases, for example, first flowing only TMS, then flowing only ozone gas, etc. Although, in some applications, the amount of carbon in the fill was somewhat reduced, it was not completely eliminated from the material.

It would be desirable to develop a process for eliminating residual carbon from a flowable insulative film or fill material.

SUMMARY OF THE INVENTION

The present invention provides methods of forming and treating insulative materials, and semiconductor devices and systems incorporating the insulative materials.

In one aspect, the invention provides a method of treating a carbon-containing oxide layer disposed on a semiconductive substrate, for example, in a trench or other opening in the substrate, by exposing the oxide layer to an oxygen plasma to eliminate a substantial amount of carbon from the oxide layer. The oxygen plasma can be formed in the reaction chamber or remotely in a downstream plasma system and then flowed into the chamber. The post-deposition oxygen plasma treatment preferably reduces the carbon in the oxide layer to a non-detectable level, and preferably to about 5% or less.

In another aspect, the post-deposition oxygen plasma treatment can be used in a method of forming an oxide layer on a semiconductor substrate. In one embodiment, the method comprises depositing a layer of a carbon-containing flowable oxide on the substrate by chemical vapor deposition of an organosilane (e.g., trimethylsilane) and an oxygen source gas (e.g., ozone), and conducting an oxygen plasma treatment according to the invention to reduce or eliminate carbon from the oxide layer, preferably to a non-detectable level. The flowable oxide material can be deposited to substantially fill high aspect ratio gaps or openings (e.g., a trench) without leaving voids, and the oxygen plasma treatment is then conducted to reduce the carbon content of the fill material to a desired level, preferably to about 5% or less.

In another embodiment, the method comprises forming a flowable oxide on a substrate, for example, by spin-coating or flow coating, and then exposing the carbon-containing oxide material to an oxygen plasma in accordance with the invention to drive out a substantial amount of the carbon from the oxide layer.

In yet another embodiment, the method of the invention comprises depositing an oxide material into a high aspect ratio opening such as a deep trench with a flowable oxide material to partially fill the opening (e.g., about one-half of the depth), and then depositing oxide material by high density plasma chemical vapor deposition (HDPCVD) to fill the rest of the opening. This method advantageously eliminates the formation of voids in the fill that can occur when solely a high density plasma oxide is used to fill a high aspect ratio gap.

In another aspect, the invention provides an oxide fill disposed on a semiconductor substrate, which comprises a flowable oxide material treated with an oxygen plasma such that carbon in the oxide material is substantially reduced, preferably to a non-detectable level. Preferably, the oxygen plasma-treated oxide material contains substantially no voids and has a carbon content of about 5% or less. The oxide fill can be disposed, for example, within a high aspect ratio opening such as a deep trench in a semiconductor substrate. The oxide fill material can be formed on the substrate as a flowable oxide by chemical vapor deposition of an organosilane (e.g., trimethylsilane) and an oxygen source gas (e.g., ozone), or, in another embodiment, by a liquid application process such as a spin-on technique of a flowable oxide material. In another embodiment, the oxygen plasma-treated oxide fill can comprise a portion of a flowable oxide material and another portion of high density plasma oxide.

Also provided according to the invention is a semiconductor device comprising a substrate and an oxygen plasma-treated flowable oxide layer, the oxide layer preferably having a carbon content of about 5% or less. The oxide layer can comprise a trench isolation structure, for example. In one embodiment, the oxide layer comprises chemical vapor deposited trimethylsilane and ozone.

In yet another aspect, the invention provides an integrated circuit device. In one embodiment, the integrated circuit device supported by a substrate, comprises an oxide layer disposed on the substrate, for example, as a fill within an opening such as a trench, the oxide layer comprising an oxygen plasma-treated flowable oxide (e.g., formed by chemical vapor deposition of trimethylsilane and ozone), the oxide layer preferably having a carbon content of about 5% or less. The integrated circuit device comprising the oxygen plasma-treated oxide layer can be incorporated into a die of a circuit module, for example, which can be incorporated into an electronic system.

The invention advantageously provides a method of readily eliminating carbon from a void-free, flowable oxide material formed in high aspect ratio openings, for example. The post-deposition plasma treatment can be conducted within the same process chamber as the deposition process. The process in accordance with the invention achieves a solid, void-free oxide fill having a reduced level of carbon that can be easily processed and will maintain its integrity in subsequent processing steps.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 1 illustrates a processing step forming a trench in a surface of the substrate. FIG. 2 shows deposition of an oxide layer into the trench. FIG. 3 depicts an oxygen plasma treatment of the oxide layer. FIG. 4 illustrates a processing step to remove excess material formed above the surface of the substrate.

FIG. 5 shows formation of a flowable oxide layer in a portion of the trench. FIG. 6 depicts formation of an overlying high density plasma oxide layer. FIG. 7 depicts an oxygen plasma treatment of the oxide fill within the trench.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for fabricating an insulative fill in a high aspect ratio opening in a semiconductor substrate in accordance with the present invention. It should be readily apparent that the processing steps are only a portion of the entire fabrication process.

In the current application, the terms "semiconductive substrate", "semiconductor substrate", wafer fragment" or "wafer" will be understood to mean any construction comprising semiconductive material, including but not limited to bulk semiconductive materials such as a semiconductor wafer (either alone or in assemblies comprising other materials thereon), and semiconductor material layers (either alone or in assemblies comprising other materials). The term "substrate" refers to any supporting structure, including, but not limited to, the semiconductive substrates described above.

The invention provides methods for forming a void-free flowable oxide layer in a semiconductor substrate and substantially eliminating carbon from the fill material.

The present invention addresses and solves problems of flowable oxide fill materials that contain high levels of carbon, particularly those formed from TMS and ozone, which are used, for example, as trench isolations, by treating the oxide fill material with an oxygen ($O_2$) plasma to drive out carbon from the material.

FIGS. 1–4 illustrate steps in an embodiment of a method of the invention for fabricating an insulative layer for a trench isolation feature in a semiconductive substrate. Other semiconductor structures than isolation trenches can also benefit from the gap filling layer of the invention. Thus, the method is not limited to the specific illustrated embodiment and has broad application to a variety of applications in IC fabrication for shallow trench isolations (STI), gate spacers, spacers between wordlines, buried digit line spacers, among others.

Figure 1:
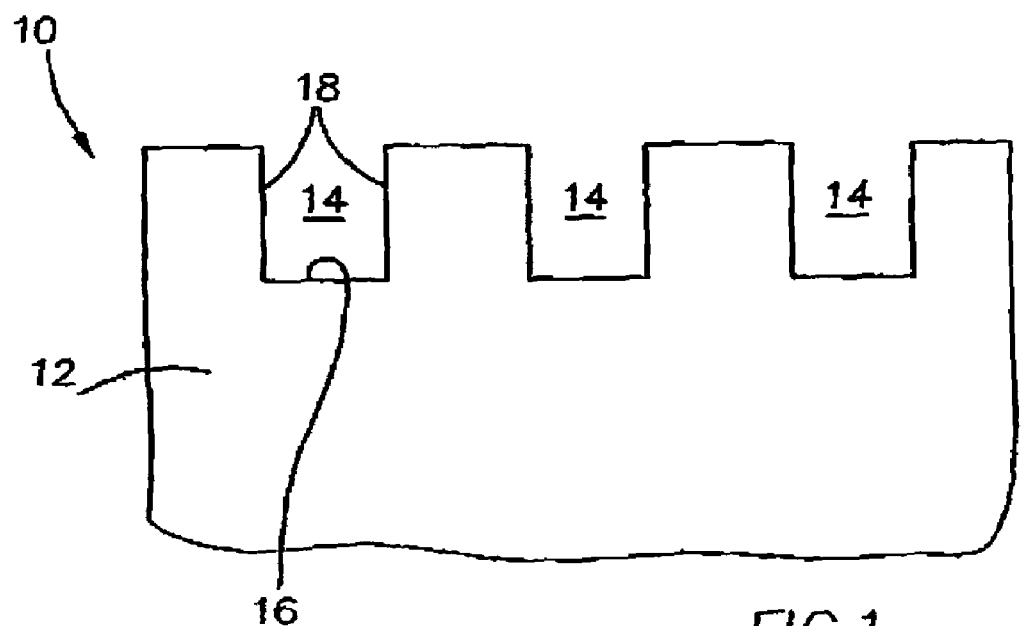
FIGS. 1–4 are diagrammatic cross-sectional views of a fragment of a semiconductor wafer substrate at sequential processing steps showing fabrication of a trench isolation according to an embodiment of the method of the invention.
Figure 2:
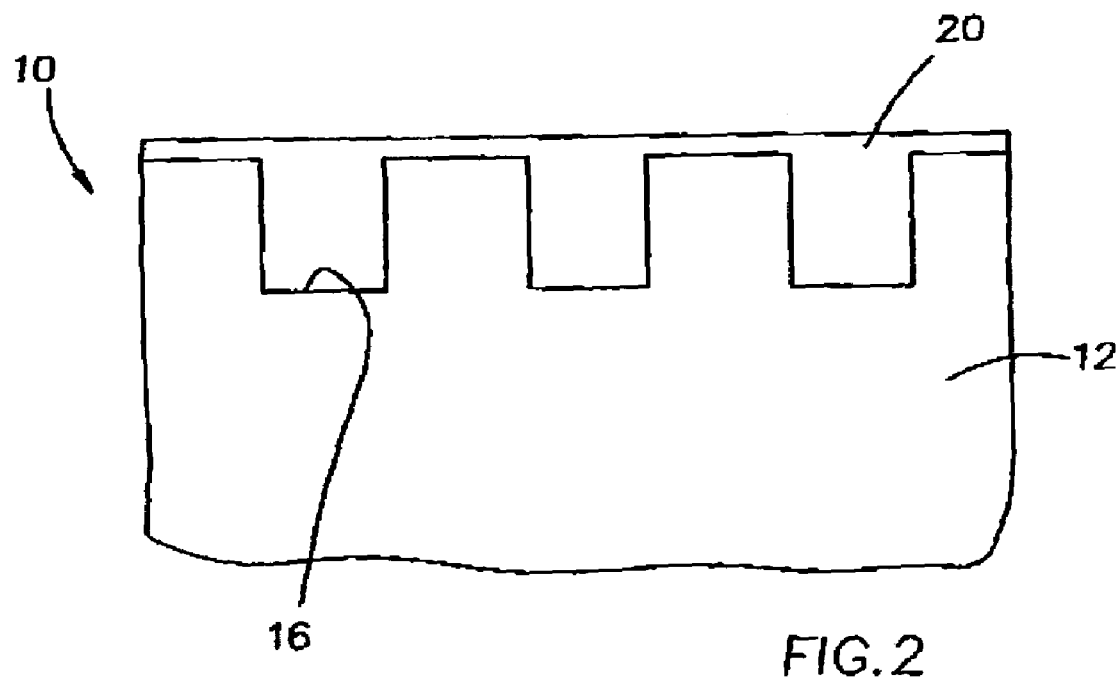

Referring to FIG. 1, an exemplary semiconductor wafer fragment is indicated generally with reference numeral 10. The substrate 12 can comprise a semiconductive material such as monocrystalline silicon, polycrystalline silicon, germanium, or gallium arsenide, or epitaxial layers of silicon support by a base semiconductor foundation, for example, or an insulating layer if silicon-on-insulator (S-O-I) or a similar technology is used. For example, in the case of a silicon-on-sapphire (S-O-S) substrate, the insulator may be sapphire. The process of the present invention has broad application to a wide variety of substrates 12.

As shown, trenches 14 have been formed into the semiconductive substrate 12. The trenches can be formed by patterning and etching the substrate around active areas of the wafer such as transistor active areas, according to known techniques. The trenches 14 include a bottom surface 16 and sidewalls 18.

In one embodiment, an oxide isolation structure 20 is then formed in the trenches 14 by chemical vapor deposition (CVD) of an oxygen source gas and a carbon-substituted silane precursor gas (organosilane) to form a material having a liquid or flowable consistency that fills the trench. Exemplary organosilanes include, for example, methylsilane ($CH_3SiH_3$), dimethylsilane (($CH_3)_2SiH_2$), trimethylsilane (($CH_3)_3SiH$)(TMS), tetramethylsilane (($CH_3)_4Si$), diethylsilane (($C_2H_5)_2SiH_2$) (DES), and $Si_xC_yH_z$ where x is 1–2, y is 1–6, and z is 4–20), being TMS in the illustrated example. Exemplary oxygen source gases for reaction with the organosilane include ozone ($O_3$), hydrogen peroxide ($H_2O_2$) vapor, nitrous oxide ($N_2O$), and nitric oxide (NO), for example, being ozone ($O_3$) in the illustrated example. The liquid nature of the deposited oxide material allows it to grow vertically from the bottom surfaces 16 of the trenches 14, and fill the trench volume as a homogenous filler material without voids or minimal void formation.

In one embodiment according to the invention, the trenches 14 are filled by reacting TMS with $O_3$ in vapor form within a CVD reaction chamber. In the reaction chamber, the wafer is heated and a chemical reaction of the precursor gases occurs. Typical deposition process parameters include a chamber pressure maintained at about 50 to about 500 torr, preferably about 300 torr, and a substrate temperature of up to about 800° C., preferably about 20 to about 450° C., preferably about 50 to about 200° C., and more preferably at about 125° C. TMS and $O_3$, and optionally a carrier gas (e.g., argon, helium, etc.), are flowed into the reaction chamber, and the TMS and $O_3$ react and gases condense onto the bottom surfaces 16 of the trenches to form a layer of flowable silicon dioxide material, such as layer 20 shown in FIG. 2, incorporating carbon in the form of methyl groups ($CH_3$). The flowable oxide material fills the trenches from the bottom surface up to the top of the trench, thereby avoiding forming voids in the center of the fill.

Figure 3:
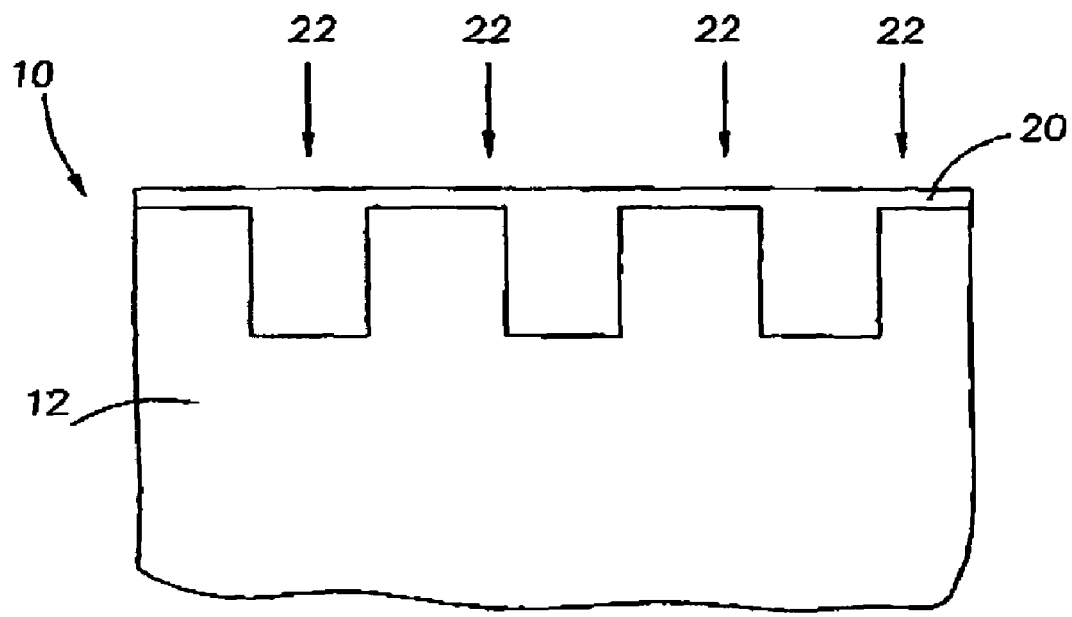
Figure 4:
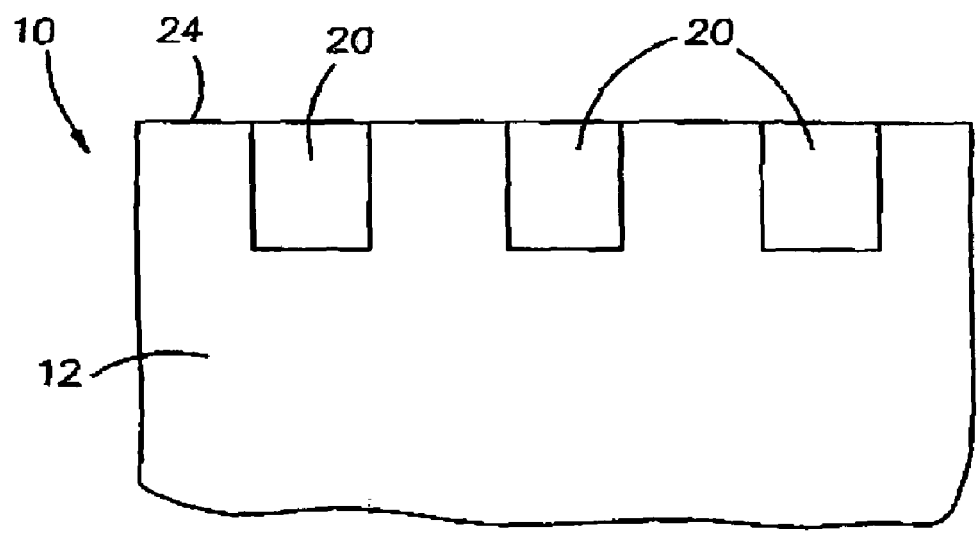

Referring now to FIG. 3, the oxide fill layer 20 is then treated with an oxygen plasma (indicated by arrows 22) effective to drive carbon out of the fill material. The oxygen plasma can be produced by flowing oxygen into a plasma generated within the reaction chamber or, in another embodiment of a deposition process, the plasma can be produced remotely from the chamber (i.e., not in the chamber) in a downstream plasma system according to known techniques. By downstream plasma system, it is meant that a plasma is generated and used to treat a compound and create reactive constituents in a particular location and then the reactive constituents are transported downstream to another location before being used as desired, generally by acting on a target. Typically, a downstream plasma system (not shown) includes a plasma chamber in flow communication by way of a conduit with the reaction chamber. Using a plasma system, the oxygen gas can be dissociated, transported downstream, and introduced into the reaction chamber to react with the flowable oxide layer 20.

The post-deposition oxygen plasma treatment of the invention can be conducted in the same reaction chamber subsequent to the oxide deposition whereby feeding the reactive gases (TMS and ozone) is ceased and a feed of oxygen ($O_2$) into the chamber is commenced while providing plasma conditions (or a remote plasma source is flowed into the chamber). Oxygen can be flowed into the plasma-containing chamber at a rate of about 1 to about 10,000 sccm, typically at a rate of about 1,000 sccm, while an RF power of about 100 to about 5,000 watts is applied, with 1,000 watts being preferred. The oxygen can be flowed together with a carrier gas such as helium, etc.

The oxide layer 20 is exposed to the oxygen plasma for a time effective to substantially eliminate carbon from the fill layer 20, preferably to a non-detectable level. The dissociated oxygen species diffuses into the layer 20 and reacts with carbon to form volatile byproducts (e.g., CO, $CO_2$). The duration of the oxygen plasma treatment can range from about 1 to about 2 seconds to up to about 100 to about 1,000 seconds or longer, generally depending on the thickness of the oxide layer 20 and wafer temperature, an extended time period being preferred to sufficiently lower the carbon content of the oxide layer to the desired level. Elevating the temperature of the wafer can accelerate the removal of carbon from the fill material. Preferably, the oxygen plasma treatment is applied for at least about 10 seconds, preferably at least about 100 seconds, at a wafer temperature of up to about 800° C., preferably about 20 to about 450° C., preferably about 50 to about 200° C., and a reaction chamber pressure of about 0.1 to about 20 torr.

The oxygen plasma treatment preferably results in a reduction of the carbon content of the deposited oxide fill layer 20 by at least about 50%, preferably by at least about 80%, preferably by at least about 98%, such that the plasma-treated oxide layer has a carbon content of about 10% or less, preferably about 5% or less, preferably about 2% or less.

Further processing can be conducted, including stripping off excess of the oxide fill material and masking layers formed above the surface of the substrate, for example, using a known chemical mechanical polishing (CMP) technique, or other technique such as wet etching and/or dry etching.

The process according to the invention advantageously results in a substantial reduction in carbon from the fill layer 20 and also offers the advantage of filing a narrow space, e.g., a trench width of about 0.06 μm, for example, and gaps having a high aspect ratio from about 7:1 to about 10:1, for example.

The present application describes a method of treating oxide fill materials by contacting the fill with an oxygen plasma to substantially eliminate carbon therefrom. While illustrated in the context of removing carbon from a flowable oxide material deposited in a trench of a semiconductor substrate by CVD of TMS and oxide, the skilled artisan will recognize many other applications for the methods disclosed herein.

For example, the method of the invention can be utilized to reduce the carbon level of flowable SiOC-based oxides deposited from other gases and/or by other processes. Another technique of forming silicon dioxide is referred to as Flowfill™ technology, which has been developed by Trikon Technology of Bristol, U.K., as described in U.S. Pat. No. 6,156,674, and U.S. Pat. Appl. Publ. No. 2002/0098684, for example, the disclosures of which are incorporated by reference herein. Flowfill™ technology has been utilized to form insulative materials comprising $(CH_3)_xSiO_{(2-y)}$, wherein y/2 is the percentage of $CH_3$ incorporated. For example, in such a process, methylsilane ($CH_3SiH_3$) (in a gaseous form) and hydrogen peroxide ($H_2O_2$) (in a liquid form) can be separately introduced into a chamber, such as a parallel plate reaction chamber. A reaction between $CH_3SiH_3$ and $H_2O_2$ can be moderated by introduction of nitrogen into the reaction chamber. A wafer is provided within the chamber, and ideally maintained at a suitably low temperature, such as 0° C., at an exemplary pressure of about 1 Torr to achieve formation of a methylsilanol structure. Such material condenses on the wafer surface. Although the reaction occurs in the gas phase, the deposited material is in the form of a viscous liquid, which flows to fill small gaps on the wafer surface. In applications where deposition thickness increases, surface tension drives the deposited layer flat, thus forming a planarized layer over the substrate.

The liquid methylsilanol is converted to a silicon dioxide structure by a two-step process occurring in two separate chambers from that in which the methylsilanol-type structure was deposited. First, planarization of the liquid film is promoted by increasing the temperature to above 100° C., while maintaining the pressure at about 1 Torr, to result in solidification and formation of a polymer layer. Thereafter, the temperature is raised to approximately 450° C., while maintaining the pressure of about 1 Torr, to form $(CH_3)_xSiO_{(2-y)}$. The processing at 450° C. also provides an advantage of driving undesired water from the resultant $(CH_3)_xSiO_{(2-y)}$ layer.

Other techniques of forming a silicon dioxide fill layer include a spin-on process by spin applying a liquid comprising an organosiloxane, by flow coating, or by using a spray technique. The solvent can be removed by baking, leaving a planarized silicon dioxide layer.

Other flowable oxide materials are known and used in the art can also benefit from the post-deposition plasma treatment in accordance with the invention. Examples of such oxide materials include various polyimides, FLARE 2.0™ dielectric (a poly(arylene)ether available from Allied Signal, Advanced Microelectronic Materials, Sunnyvale, Calif.), Black-Diamond™ dielectric (available from Applied Materials, Santa Clara, Calif.), BCB (divinylsiloxane bisbenzocyclobutene) and Silk™, an organic polymer similar to BCB (both available from Dow Chemical Co., Midland, Mich.), among others. Such materials can be applied by various techniques including spin-on and CVD processes.

Treatment of the organic carbon-containing oxide materials in accordance with embodiments of the invention employing an oxygen plasma substantially reduces the carbon content of such carbon-containing oxide materials.

Figure 5:
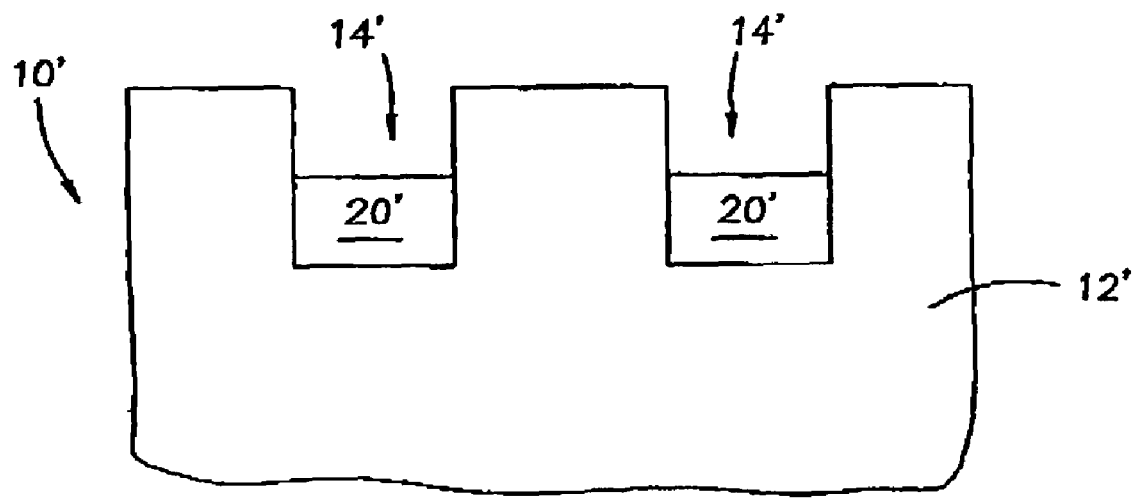
FIG. 5-7 are diagrammatic cross-sectional views of a fragment of a semiconductor wafer substrate at sequential processing steps showing fabrication of a trench isolation according to another embodiment of the method of the invention.
Figure 6:
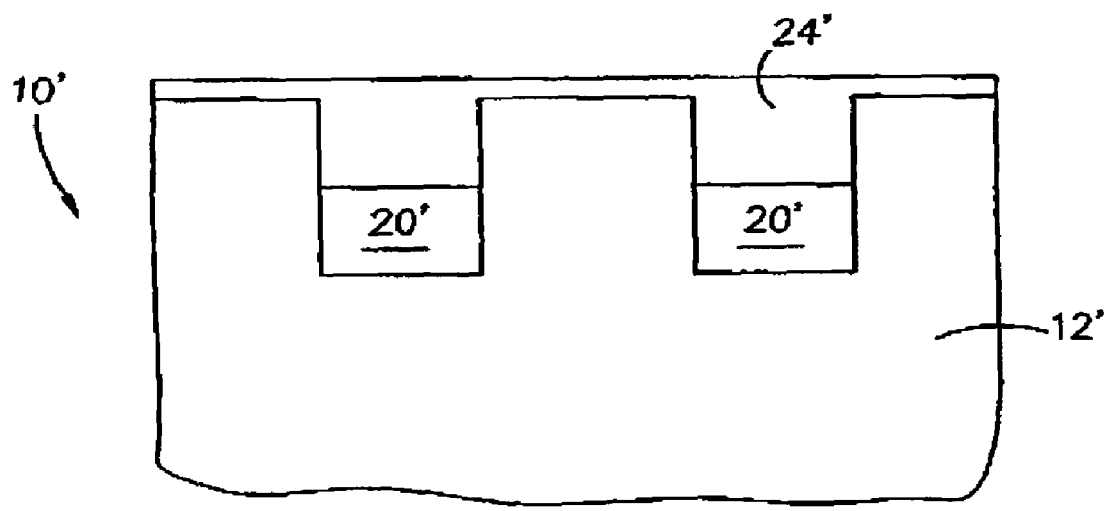
Figure 7:
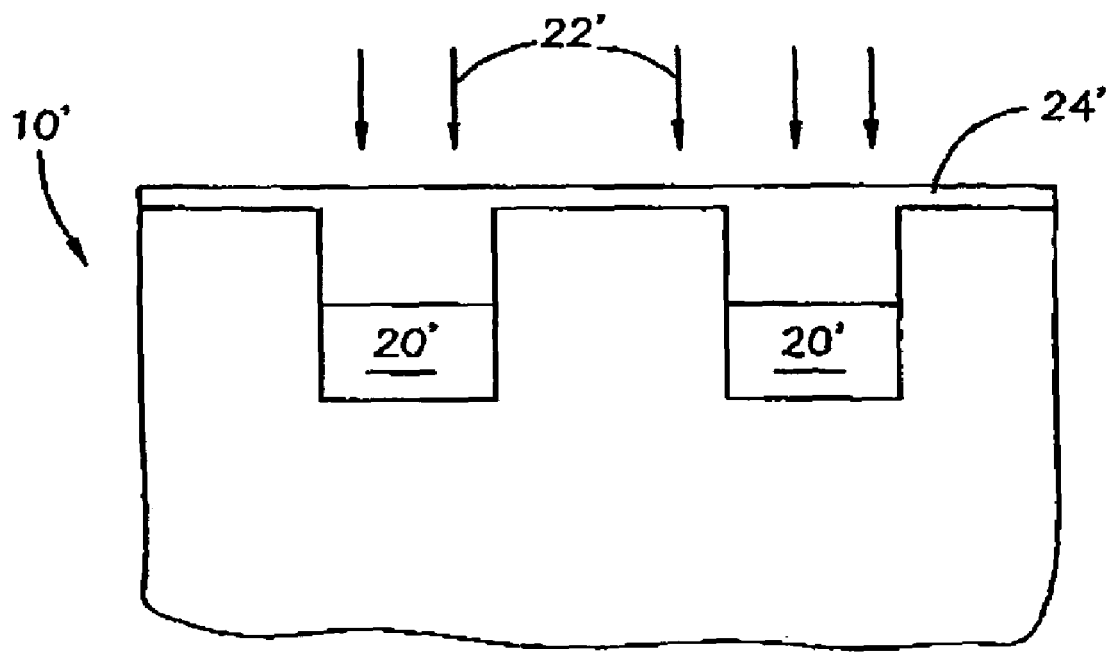

FIGS. 5–7 illustrate steps in another embodiment of a method in accordance with the invention for forming an oxide fill in an opening in a substrate of a wafer fragment 10'. Referring to FIG. 5, a portion (e.g., about one-half) of a trench 14' disposed in a substrate 12' is filled with an oxide layer 20' comprising a flowable oxide material, as described hereinabove. The remainder of the opening 14' can then be filled with a high density plasma oxide material 24' using a conventional high density plasma chemical vapor deposition (HDPCVD). Briefly, the silicon oxide is deposited in a reaction zone of a HDPCVD reactor while providing a selected bias power, source power and gas mixtures. Exemplary silicon source gases include, for example, silicon tetrachloride ($SiCl_4$), silicon tetrabromide ($SiBr_4$), dichlorosilane ($SiH_2Cl_2$), and disilane ($Si_2H_6$). Exemplary gases to react with the silicon source gas include oxygen, ozone, nitrous oxide ($N_2O$), and nitric oxide (NO), for example, along with a carrier gas such as argon or helium.

Figure 8:
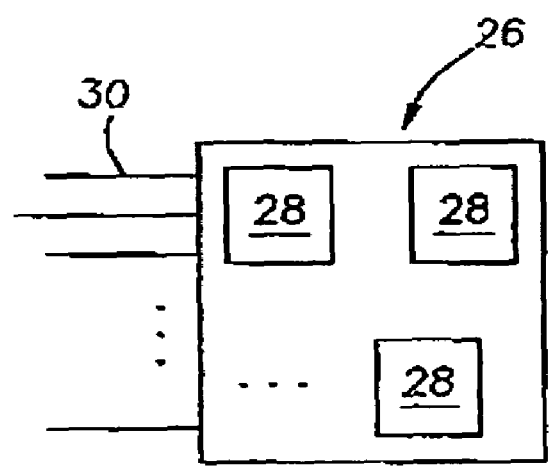
FIG. 8 is a block diagram of a circuit module according to an embodiment of the present invention.

FIG. 8 is a block diagram of an embodiment of a circuit module 26 in which the present invention can be incorporated. Such modules, devices and systems (e.g., processor systems) incorporating the module are described and illustrated in U.S. Pat. No. 6,437,417 (Gilton) and U.S. Pat. No. 6,465,829 (Agarwal), the disclosures of which are incorporated by reference herein. In brief, two or more dies 28 may be combined into a circuit module 26 to enhance or extend the functionality of an individual die 28. Circuit module 26 may be a combination of dies 28 representing a variety of functions, or a combination of dies containing the same functionality. One or more dies 28 of the circuit module can contain circuitry, or integrated circuit devices, that includes at least one $O_2$ plasma-treated flowable oxide layer in accordance with the embodiments of the present invention. The integrated circuit devices can include a memory cell that comprises an oxide layer as discussed in the various embodiments in accordance with the invention.

Some examples of a circuit module include memory modules, device drivers, power modules, communication modems, processor modules, and application-specific modules, and may include multilayer, multichip modules. Circuit module 26 may be a subcomponent of a variety of electronic systems, such as a clock, a television, a cell phone, a personal computer, an automobile, an industrial control system, an aircraft, among others. Circuit module 26 will have a variety of leads 30 extending therefrom and coupled to the dies 28 providing unilateral or bilateral communication and control.

The circuit module can be incorporated, for example, into an electronic system that comprises a user interface, for example, a keyboard, monitor, display, printer, speakers, etc. One or more circuit modules can comprise a microprocessor that provides information to the user interface, or is otherwise programmed to carry out particular functions as is known in the art. The electronic system can comprise, for example, a computer system including a processor and a memory system as a subcomponent, and optionally user interface components, and other associated components such as modems, device driver cards, etc. Examples of memory circuits include but are not limited to DRAM (Dynamic Random Access Memory), SRAM (Static Random Access Memory), Flash memories, a synchronous DRAM such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

EXAMPLE

Carbon-containing oxide films were deposited from TMS and $O_3$ by a CVD process onto three wafer surfaces. Process parameters included a chamber pressure of about 100 torr and a wafer temperature of about 125° C., utilizing a Centura DxZ CVD deposition chamber from Applied Materials, Inc.

The two test films were then treated with an oxygen plasma under the same process parameters. The Control film received no post-deposition treatment with oxygen plasma. Table 1 provides the average of the bulk atomic concentrations (%) of the Test oxide layers and the Control layer.

TABLE 1

| Slot | C | O | F | Si bonded to O | Si/O |
|---|---|---|---|---|---|
| Test wafer #1 (plasma treated) | nd | 63.5 | 0.3 | 36.1 | 0.57 |
| Test wafer #2 (plasma treated) | nd | 63.3 | 0.2 | 36.4 | 0.58 |
| Control wafer | 29.8 | 36.8 | 0.2 | 32.6 | 0.89 |

The results show a significant difference between the average of the bulk atomic concentrations (%) of the oxide layer of the test wafers exposed to the post-deposition treatment and the Control wafer. The results demonstrate that while the untreated Control wafer had an about 30% carbon content, the oxygen plasma post-deposition treatment was successful in eliminating the carbon content of the test wafers to a non-detectable level.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of treating a carbon-containing oxide layer situated on a semiconductive substrate, said carbon-containing oxide layer having a thickness, the method comprising the step of:
   exposing said carbon-containing oxide layer to an oxygen plasma to reduce the carbon throughout the thickness of said oxide layer by at least about 50%.

2. The method of claim 1, wherein the carbon-containing oxide layer comprises a fill within an opening in the substrate.

3. The method of claim 2, wherein the opening comprises an aspect ratio of about 7:1 to about 10:1.

4. The method of claim 2, wherein the carbon-containing oxide layer comprises a trench isolation area.

5. A method of treating a carbon-containing oxide layer situated on a semiconductive substrate, the carbon-containing oxide layer having a thickness, the method comprising the step of:

exposing said carbon-containing oxide layer to an oxygen plasma to reduce the carbon throughout the thickness of said oxide layer by at least about 80%.

6. A method of treating a carbon-containing oxide layer situated on a semiconductive substrate, the carbon-containing oxide layer having a thickness and a detectable carbon content, the method comprising the step of:
exposing the carbon-containing oxide layer to an oxygen plasma for at least about 10 seconds at a substrate temperature of up to about 800° C. to reduce the carbon throughout the thickness of the oxide layer to a non-detectable level.

7. The method of claim 6, wherein the carbon-containing oxide layer is exposed to the oxygen plasma at a substrate temperature of about 20 to about 450° C.

8. The method of claim 6, wherein the carbon-containing oxide layer is exposed to the oxygen plasma for at least about 100 seconds.

9. A method of treating a carbon-containing oxide layer in a semiconductive substrate, the carbon-containing oxide layer having a thickness and containing an amount of carbon, the method comprising the step of:
exposing the carbon-containing oxide layer to an oxygen plasma for a time effective to reduce said amount of carbon throughout the thickness of the oxide layer to a non-detectable level.

10. The method of claim 9, wherein the amount of carbon is reduced by at least about 50%.

11. The method of claim 9, wherein the carbon-containing oxide layer is exposed to the oxygen plasma for at least about 100 seconds at a substrate temperature of up to about 800° C.

12. A method of treating a carbon-containing flowable oxide layer, the carbon-containing oxide layer having a thickness and containing a detectable amount of carbon, the method comprising the step of:
exposing the carbon-containing oxide layer throughout said thickness to an oxygen plasma at a temperature of up to about 800° C., and a time effective to reduce said detectable amount of carbon to a non-detectable amount throughout the thickness of said oxide layer.

13. A method of treating a carbon-containing oxide fill situated on a semiconductive substrate, comprising the steps of:
depositing a flowable oxide material to form an oxide fill in a gap within the substrate, the oxide fill comprising a thickness and an amount of carbon; and
exposing the formed oxide fill to an oxygen plasma to substantially eliminate said initial amount of carbon throughout the oxide fill.

14. A method of treating an oxide layer on a semiconductive substrate, comprising the steps of:
depositing an organosilane and an oxygen source gas by chemical vapor deposition onto the substrate to form a carbon-containing flowable oxide layer having a thickness and containing an amount of carbon; and
exposing the formed carbon-containing oxide layer to an oxygen plasma to substantially eliminate said amount of carbon from the oxide layer throughout said thickness.

15. A method of treating an oxide layer on a semiconductive substrate, comprising the steps of:
depositing trimethylsilane and ozone by chemical vapor deposition to form a carbon-containing flowable oxide fill within a gap in the substrate, the oxide fill having a thickness and containing an amount of carbon; and exposing the formed carbon-containing oxide fill to an oxygen plasma to substantially eliminate said amount of carbon throughout the fill.

16. A method of treating a substrate, comprising the step of:
heating the substrate comprising a carbon-containing flowable oxide layer in a reaction chamber to a temperature of up to about 800° C., the oxide layer comprising a thickness and an amount of carbon;
maintaining a pressure within the reaction chamber at about 0.1 to about 20 torr; and
exposing the substrate to an oxygen plasma for a time effective to eliminate a substantial amount of said carbon throughout the thickness of the carbon-containing oxide layer.

17. The method of claim 16, wherein the step of exposing is conducted to reduce the amount of carbon in the carbon-containing oxide layer by at least about 80%.

18. The method of claim 16, further comprising:
forming the oxygen plasma in a downstream plasma system; and
flowing the oxygen plasma into the reaction chamber.

19. The method of claim 16, further comprising:
flowing an oxygen gas into the reaction chamber; and
forming the oxygen plasma within the chamber.

20. A method of forming an oxide layer on a semiconductor substrate, comprising the steps of:
depositing a layer of flowable oxide comprising carbon on the substrate, the oxide layer comprising a thickness and a detectable amount of carbon; and
then exposing said carbon-comprising oxide layer to an oxygen plasma to substantially eliminate carbon and reduce said amount of carbon to a non-detectable level throughout the thickness of the oxide layer.

21. The method of claim 20, wherein the step of depositing comprises chemical vapor deposition of an organosilane and an oxygen source gas.

22. The method of claim 21, wherein the organosilane is selected from the group consisting of methylsilane, dimethylsilane, trimethylsilane, tetramethylsilane, diethylsilane, and $Si_xC_yH_z$ where x is 1–2, y is 1–6, and z is 4–20.

23. The method of claim 21, wherein the oxygen source gas is selected from the group consisting of ozone, hydrogen peroxide vapor, nitrous oxide, and nitric oxide.

24. The method of claim 21, wherein the step of depositing comprises spin applying a flowable carbon-containing oxide material.

25. The method of claim 20, wherein the carbon-containing oxide layer is deposited to fill an opening in the substrate.

26. The method of claim 25, wherein the opening comprises an aspect ratio of about 7:1 to about 10:1.

27. The method of claim 25, wherein the carbon-containing oxide layer comprises a trench isolation area.

28. The method of claim 20, wherein the step of exposing comprises:
heating the substrate in a reaction chamber to a temperature of up to about 800° C.

29. The method of claim 28, wherein the substrate is heated to a temperature of about 20 to about 450° C.

30. The method of claim 28, wherein the substrate is heated to a temperature of about 50 to about 200° C.

31. The method of claim 28, wherein the substrate is heated to a temperature of about 125° C.

32. The method of claim 20, wherein the step of exposing comprises remotely forming the oxygen plasma and flowing the oxygen plasma into the reaction chamber.

33. The method of claim 20, wherein the step of exposing comprises flowing an oxygen gas into the reaction chamber, and forming the oxygen plasma within the chamber.

34. A method of forming an oxide layer on a semiconductor substrate, comprising the steps of:
depositing a layer of flowable oxide comprising carbon on the substrate, the layer having a thickness and a detectable level of carbon;
heating the substrate to a temperature of up to about 800° C.; and
then exposing the oxide layer throughout said thickness to an oxygen plasma to substantially eliminate carbon and reduce the carbon to a non-detectable level throughout the thickness of the oxide layer.

35. The method of claim 34, wherein the depositing step comprises chemical vapor deposition of an organosilane and an oxygen source gas.

36. The method of claim 35, wherein the depositing step comprises chemical vapor deposition of trimethylsilane and ozone.

37. The method of claim 34, wherein the depositing step comprises spin applying a flowable carbon-comprising oxide material.

38. The method of claim 34, wherein the carbon-comprising oxide layer is deposited to fill a gap in the substrate.

39. The method of claim 38, wherein the gap comprises an aspect ratio of about 7:1 to about 10:1.

40. A method of forming an oxide layer on a semiconductor substrate, comprising the steps of:
depositing a flowable oxide comprising carbon on the substrate by chemical vapor deposition of trimethylsilane and ozone to form a layer having a thickness and comprising a detectable amount of carbon; and
exposing the formed carbon-comprising oxide layer to an oxygen plasma to substantially eliminate carbon throughout the thickness of the oxide layer to a non-detectable amount of carbon.

41. A method of forming an oxide layer on a semiconductor substrate, comprising the steps of:
depositing a flowable oxide comprising carbon on the substrate to form a layer having a thickness and comprising a detectable amount of carbon;
heating the substrate to a temperature of up to about 20–450° C.; and
exposing the formed carbon-comprising oxide layer to an oxygen plasma to substantially eliminate carbon throughout the thickness of the oxide layer to a non-detectable amount of carbon.

42. A method of forming an oxide fill on a substrate, comprising the steps of:
depositing a flowable oxide comprising carbon to form a fill within a gap in the substrate, the fill having a thickness and comprising a detectable amount of carbon; and
exposing the formed carbon-comprising oxide fill to an oxygen plasma to substantially eliminate carbon throughout the thickness of the oxide fill to a non-detectable amount of carbon.

43. The method of claim 42, wherein the gap has an aspect ratio of about 7:1 to about 10:1.

44. A method of forming an oxide layer on a semiconductor substrate, comprising the steps of:
depositing a flowable oxide comprising carbon on the substrate to form a layer having a thickness and comprising a detectable amount of carbon;
forming an oxygen plasma in a downstream plasma system;
flowing the oxygen plasma into the reaction chamber; and
exposing the formed carbon-comprising oxide layer to the oxygen plasma to substantially eliminate carbon throughout the thickness of the oxide layer to a non-detectable amount of carbon.

45. A method of forming an oxide layer on a semiconductor substrate, comprising the steps of:
depositing a flowable oxide comprising carbon on the substrate to form a layer having a thickness and comprising a detectable amount of carbon;
forming an oxygen plasma in the reaction chamber; and
exposing the formed carbon-comprising oxide layer to the oxygen plasma to substantially eliminate carbon throughout the thickness of the oxide layer to a non-detectable amount of carbon.

46. A method of forming an oxide layer on a semiconductor substrate, comprising the steps of:
spin applying a flowable oxide comprising carbon to form an oxide fill within a gap within the substrate, the fill comprising a thickness and a detectable carbon content, the substrate positioned within a reaction chamber;
providing an oxygen plasma in the reaction chamber; and
exposing the formed carbon-comprising oxide fill to the oxygen plasma to reduce the carbon content throughout the thickness of the oxide fill to a non-detectable amount of carbon.

47. The method of claim 46, wherein the carbon content throughout the thickness of the oxide fill is reduced by at least about 80% to said non-detectable level.

48. The method of claim 46, wherein the exposing step comprises exposing the carbon-comprising oxide fill to the oxygen plasma for at least about 100 seconds at a substrate temperature of about 20 to about 450° C.

49. A method of filling an opening in a substrate, comprising the steps of:
depositing a carbon-containing flowable oxide to form an oxide fill within the opening, the oxide fill comprising a thickness and an amount of carbon; and
exposing the formed oxide fill to an oxygen plasma to substantially eliminate the amount of carbon throughout the thickness of the oxide fill.

50. The method of claim 49, wherein the depositing step comprises chemical vapor deposition of an organosilane and an oxygen source gas.

51. The method of claim 49, wherein the depositing step comprises chemical vapor deposition of trimethylsilane and ozone.

52. The method of claim 49, wherein the depositing step comprises spin applying a carbon-containing flowable oxide material.

53. The method of claim 49, wherein the opening comprises an aspect ratio of about 7:1 to about 10:1.

54. The method of claim 49, wherein the opening comprises a trench.

55. The method of claim 49, wherein the amount of carbon within the formed oxide fill is reduced to a non-detectable level.

56. The method of claim 49, wherein the amount of carbon within the formed oxide fill is reduced by at least about 80%.

57. The method of claim 49, wherein the exposing step comprises exposing the carbon-containing oxide layer to the oxygen plasma for at least about 10 seconds at a substrate temperature of up to about 800° C.

58. The method of claim 49, wherein the exposing step comprises exposing the formed carbon-containing oxide layer to the oxygen plasma for at least about 100 seconds at a substrate temperature of up to about 20 to about 450° C.

59. A method of filling an opening in a substrate, comprising the steps of:

depositing a flowable oxide comprising carbon by chemical vapor deposition of trimethylsilane and ozone to form a carbon-comprising oxide fill within the opening, the oxide fill comprising a thickness and an amount of carbon; and exposing the formed oxide fill to an oxygen plasma for at least about 100 seconds at a substrate temperature of about 20 to about 450° C. to reduce the amount of carbon throughout the thickness of the oxide fill to about 10% or less.

60. A method of filling an opening in a substrate, comprising the steps of:

depositing a flowable oxide comprising carbon to partially fill the opening, the oxide fill comprising a thickness and an amount of carbon;

depositing a layer of high density plasma oxide to fill the opening; and then applying an oxygen plasma to reduce the amount of carbon throughout the thickness of the carbon-comprising flowable oxide fill by at least about 80%.

61. A method of filling a high aspect ratio opening in a substrate, the opening having an aspect ratio of about 7:1 to about 10:1, the method comprising the steps of:

depositing a flowable oxide to form an oxide fill within the opening, the oxide fill comprising a thickness and an amount of carbon; and then exposing the formed oxide fill to an oxygen plasma for at least about 10 seconds at a substrate temperature of up to about 800° C. to reduce said amount of carbon throughout the thickness of the oxide layer by at least about 80% to a non-detectable level throughout the thickness of the oxide fill.

62. A method of filling a high aspect ratio opening in a substrate, the opening having an aspect ratio of about 7:1 to about 10:1, the method comprising the steps of:

depositing trimethylsilane and ozone by chemical vapor deposition to form a carbon-containing flowable oxide fill within the opening, the oxide fill comprising a thickness and an amount of residual carbon; and exposing the formed oxide fill to an oxygen plasma for at least about 10 seconds at a substrate temperature of up to about 800° C. to reduce said amount of residual carbon in the oxide fill by at least about 80% to a non-detectable level throughout the oxide fill.

63. The method of claim 62, wherein the substrate is situated within a reaction chamber, and the exposing step comprises flowing an oxygen source into a plasma within the reaction chamber.

64. The method of claim 62, wherein the substrate is situated within a reaction chamber, and the exposing step comprises remotely forming the oxygen plasma and flowing the oxygen plasma into the reactor chamber.

* * * * *